(12) United States Patent
Hussein et al.

(10) Patent No.: US 11,588,091 B2
(45) Date of Patent: Feb. 21, 2023

(54) THERMOELECTRIC DEVICES BASED ON NANOPHONONIC METAMATERIALS

(71) Applicants: The Regents of the University of Colorado, a body corporate, Denver, CO (US); Government of the United States of America, as represented by the Secretary of Commerce, Gaithersburg, MD (US)

(72) Inventors: Mahmoud Hussein, Boulder, CO (US); Kristine A. Bertness, Boulder, CO (US); Howard Branz, Boulder, CO (US); Joel C. Weber, Boulder, CO (US)

(73) Assignees: Government of the United States of America, as represented by the Secretary of Commerce, Gaithersburg, MD (US); The Regents of the University of Colorado, a body corporate, Denver, CO (US)

( * ) Notice: Subject to any disclaimer, the term of this patent is extended or adjusted under 35 U.S.C. 154(b) by 91 days.

(21) Appl. No.: 16/271,823

(22) Filed: Feb. 9, 2019

(65) Prior Publication Data
US 2020/0028049 A1    Jan. 23, 2020

Related U.S. Application Data

(60) Provisional application No. 62/628,741, filed on Feb. 9, 2018.

(51) Int. Cl.
*H01L 35/14* (2006.01)
*H01L 35/10* (2006.01)
(Continued)

(52) U.S. Cl.
CPC .............. *H01L 35/14* (2013.01); *F25B 21/02* (2013.01); *H01L 35/10* (2013.01); *H01L 35/28* (2013.01)

(58) Field of Classification Search
None
See application file for complete search history.

(56) References Cited

U.S. PATENT DOCUMENTS 2,844,638 A * 7/1958 Lindenblad ............. H01L 35/32
136/203
2011/0114145 A1 5/2011 Yang et al.
(Continued)

OTHER PUBLICATIONS

PCT Application No. PCT/US2019/017398, International Preliminary Report on Patentability, dated Aug. 11, 2020.
(Continued)

*Primary Examiner* — Shannon M Gardner
(74) *Attorney, Agent, or Firm* — Lathrop GPM LLP

(57) ABSTRACT

A nanophononic metamaterial-based thermoelectric energy conversion device and processes for fabricating a nanophononic metamaterial-based thermoelectric energy conversion device is provided. In one implementation, for example, a nanophononic metamaterial-based thermoelectric energy conversion device includes a first conductive pad, a second conductive pad, and a plurality of strip units. In one implementation, the first conductive pad is coupled to a first connection of the thermoelectric energy conversion device, and the second conductive pad is coupled to a second connection of the thermoelectric energy conversion device. The plurality of strip units are connected in series between the first and second conductive pads and provide a parallel heat transfer pathway. The strip units include a nanostructure design comprising a nanophononic metamaterial.

20 Claims, 14 Drawing Sheets

(51) Int. Cl.
    *H01L 35/28*    (2006.01)
    *F25B 21/02*    (2006.01)

(56)            References Cited

U.S. PATENT DOCUMENTS

| 2012/0097204 | A1* | 4/2012  | Yu ........................ H01L 35/26 |
|              |     |         | 136/200 |
| 2013/0255738 | A1  | 10/2013 | Mitrovic et al. |
| 2013/0340801 | A1  | 12/2013 | Zhang et al. |
| 2015/0340583 | A1  | 11/2015 | Narducci et al. |
| 2017/0047499 | A1  | 2/2017  | Hussein |
| 2018/0309039 | A1* | 10/2018 | Hussein ................ H01L 35/34 |

OTHER PUBLICATIONS

PCT Application No. PCT/US2019/017398, International Search Report and Written Opinion, dated Jul. 5, 2019.
El-Kady et al., Manipulation Thermal Phonons: A Phononic Crystal Route to High-ZT Thermoelectrics, Photonic and Phononic Properties of Engineered Nanostructures, SPIE 1000 20th St., 9 pages, 2011.
EP Application No. 19750538.1 Extended European Search Report, dated Feb. 3, 2022, 11 pages.
EP Application No. 19750538.1 EP Search Report, dated Nov. 3, 2021, 13 pages.

* cited by examiner

THERMOELECTRIC DEVICES BASED ON NANOPHONONIC METAMATERIALS

CROSS-REFERENCE TO RELATED APPLICATIONS

This application claims the benefit of U.S. provisional application No. 62/628,741, filed Feb. 9, 2018, which is hereby incorporated by reference as though fully set forth herein.

BACKGROUND a. Field

The present disclosure relates to thermoelectric devices, such as thermoelectric generators and Peltier refrigeration devices, that convert between heat and electrical energy.

b. Background

Thermoelectric devices, such as thermoelectric generators and Peltier refrigeration devices, transform heat energy into electrical energy or vice versa. A thermoelectric efficiency can be a used to analyze thermoelectric device performance. A figure of merit, ZT, can be used to analyze thermoelectric material performance. One key requirement for a high-ZT material is to have low thermal conductivity (K) while simultaneously having high electrical conductivity and high Seebeck coefficient. The challenge, however, is that these two properties are tightly coupled in existing materials, particularly in inexpensive industrial materials like silicon. Over the last two decades, a dominant philosophy for increasing ZT has been to embed obstacles (such as small imperfections, holes, ions, particles and/or interfaces) within the material in order to scatter the heat-carrying phonons and reduce the thermal conductivity such as shown in FIG. 1. While modestly successful, this strategy has not been transformational for generating high ZT values since the obstacles that operate to scatter heat carrying phonons also impede the flow of electronic carrier and, thus, reduce the electrical conductivity.

BRIEF SUMMARY

A nanophononic metamaterial-based thermoelectric energy conversion device and processes for fabricating a nanophononic metamaterial-based thermoelectric energy conversion device is provided. In one implementation, for example, a nanophononic metamaterial-based thermoelectric energy conversion device includes a first conductive pad, a second conductive pad, and a plurality of strip units. In one implementation, the first conductive pad is coupled to a first connection of the thermoelectric energy conversion device, and the second conductive pad is coupled to a second connection of the thermoelectric energy conversion device. The plurality of strip units are connected in series between the first and second conductive pads and provide a parallel heat transfer pathway. The strip units include a nanostructure design comprising a nanophononic metamaterial.

In one implementation, a process of making a nanophononic material-based thermoelectric energy conversion device includes attaching a semiconductor material to a carrier wafer. The process further includes fabricating nanomembranes and nanostructure resonators extending from the nanomembranes in the semiconductor, wherein the nanomembranes each comprise an electronic carrier transport region extending through the membrane, and the nanostructure resonators extend from the nanomembranes external to the electronic carrier transport region.

The foregoing and other aspects, features, details, utilities, and advantages of the present invention will be apparent from reading the following description and claims, and from reviewing the accompanying drawings.

DETAILED DESCRIPTION

Figures 1, 2:
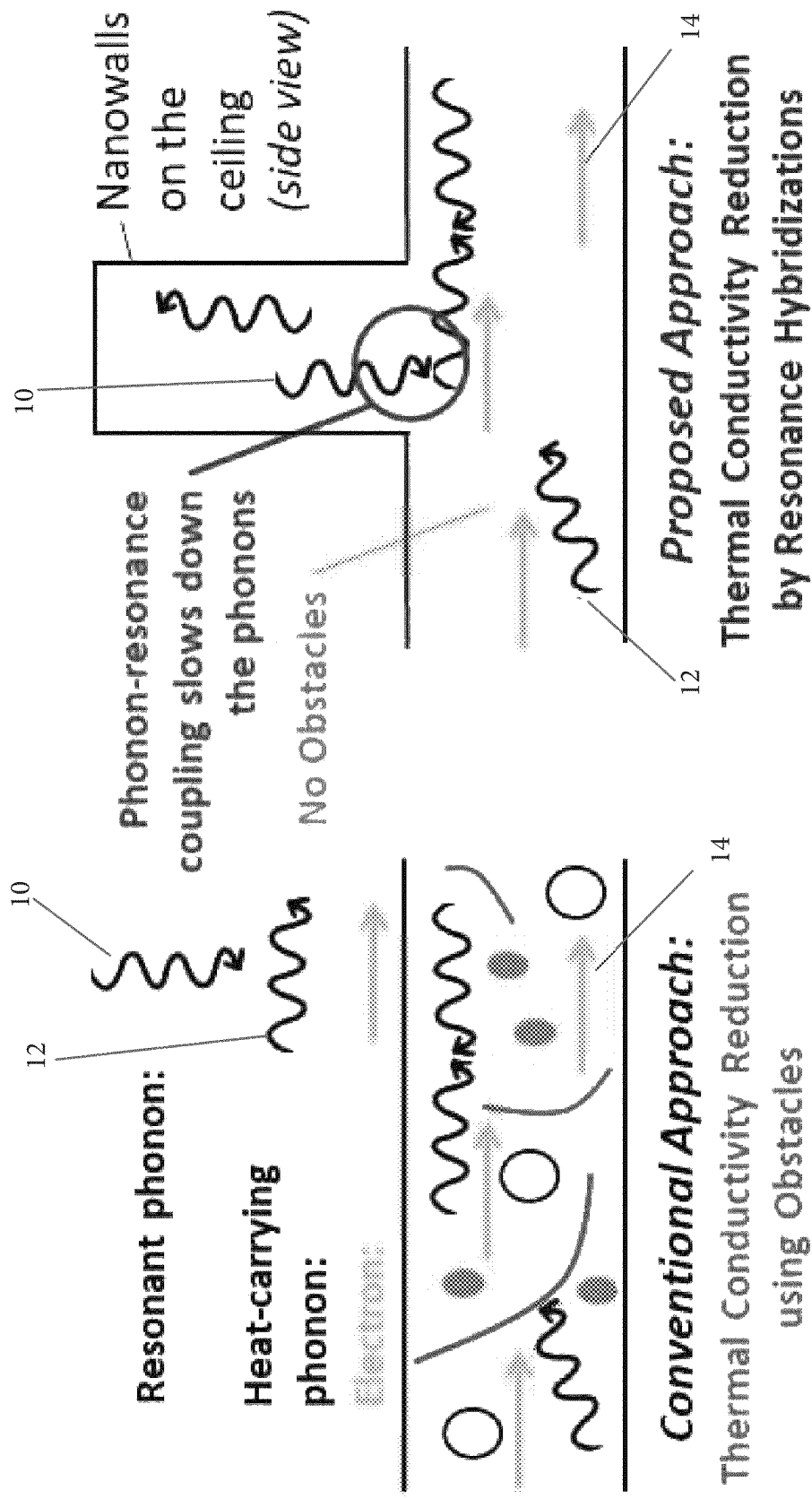
FIG. 1 illustrates a schematic view of a conventional approach to reducing thermal conductivity via heat carrying phonons using obstacles.
FIG. 2 illustrates an example implementation of a thermoelectric energy conversion material comprising nanopillars or nanowalls disposed at least generally perpendicular to membrane surfaces of the device.

Example implementations of thermoelectric devices (e.g., thermoelectric generators and Peltier refrigeration devices) include nanostructure designed thermoelectric materials that can be used to convert temperature differences into electricity or electricity into temperature differences are provided. Example processes for fabricating such nanostructured thermoelectric material-based devices are also provided. In some implementations, for example, the thermoelectric devices can provide thermoelectric energy conversion efficiency and fabrication processes for making such thermoelectric devices provide a manufacturable platform based on nanofabrication (e.g., silicon nanofabrication). In some implementations, for example, a thermoelectric material in a thermoelectric device comprises a material design called nanophononic metamaterials (NPMs) that uses resonant structures located outside a path of an electronic carrier flow to reduce thermal conductivity through a broad-spectrum mechanism of resonance hybridization, mode localization, and phonon lifetime reduction. This approach can be used to circumvent a problem currently facing attempts to improve thermoelectric materials in which nanostructures or ionic cage structures are used to form scattering centers that lower thermal conductivity but also inhibit electrical transport, thus providing a trade-off between the two paths to improved performance.

Examples of nanostructured thermoelectric materials include a nanophononic metamaterial adapted to reduce thermal conductivity by slowing group velocities of heat carrying phonons in a base material via one or more resonator. Examples of nanophononic metamaterials and their structures are described in U.S. patent application Ser. No. 15/289,921 entitled "Nanophononic metamaterials" and filed on Oct. 10, 2016, U.S. patent application Ser. No. 15/238,711 entitled "Nanophononic metamaterials" and filed on Aug. 16, 2016, and U.S. patent application Ser. No. 14/247,228 entitled "Nanophononic metamaterials" and filed on Apr. 7, 2014, each of which are incorporated by reference in their entirety. As described in the applications, the resonators can, in principal, have any number of shapes or forms, such as but not limited to pillars, walls, membranes, inclusions (e.g., amorphous or graphite coated inclusions). Although particular examples described herein refer to example configurations (e.g., membranes with pillars or walls), those configurations are merely examples and are not considered limiting as many other configurations are disclosed in the patent applications incorporated by reference.

In principle, nanophononic metamaterials can be formed of any type of material nanostructured into a nanophononic metamaterial including a resonator. While many implementations are described with silicon as a constituent material from which the nanophononic metamaterial is formed, other materials, especially crystalline semiconductor materials may be used to form a nanophononic metamaterial. Non-limiting examples other constituent materials from which a nanophononic metamaterial may be structured include BiSbTe alloys, PbTe, half-Heusler alloys, and silicon alloys such as SiGe alloys. Further, nanophononic metamaterials may be nanostructured out of a single material (e.g., silicon), mixed materials where at least one of those materials is an active thermoelectric component, materials in which the nanostructures are multilayered, as when manufactured with a combination of etching and redeposition (e.g., with atomic layer epitaxy or other evaporation or solution material coating method).

In some implementations of nanophononic metamaterial-based thermoelectric devices, the nanophononic metamaterial thermoelectric materials may be designed to avoid interfaces or voids/inclusions within the electronic carrier transport pathway in order to maintain high mobility. Similarly, resonators may be disposed within a membrane, as opposed to and/or in conjunction with resonators extending away from the membrane, while still maintaining at least one electronic carrier transport pathway that is not obstructed.

FIG. 2 shows a side schematic view of an example nanophononic metamaterial structured to reduce thermal conductivity through resonance hybridizations. In this particular example, a nanophononic metamaterial (NPM) structure is based on a thin membrane, such as silicon, with thick and closely packed walls or pillars (e.g., nano-scale walls or pillars) perpendicular to and extending away from the membrane. The walls or pillars, in this example, are disposed outside the flow of both heat phonons 12 and electronic carriers 14 (transport region of the membrane) in contrast to a conventional thermoelectric material that reduces thermal conductivity through the use of obstacles disposed in the transport region such as shown in FIG. 1. As described below both theoretical and experimental results show that the nanowalls act, metaphorically, as a "phonon blockade," reducing thermal conductivity of the membrane without affecting (or at least significantly affecting) its electrical conductivity. This approach to increase the thermoelectric figure of merit ZT thus breaks out of the trade-off that has limited ZT.

Figures 3A, 3B, 3C:
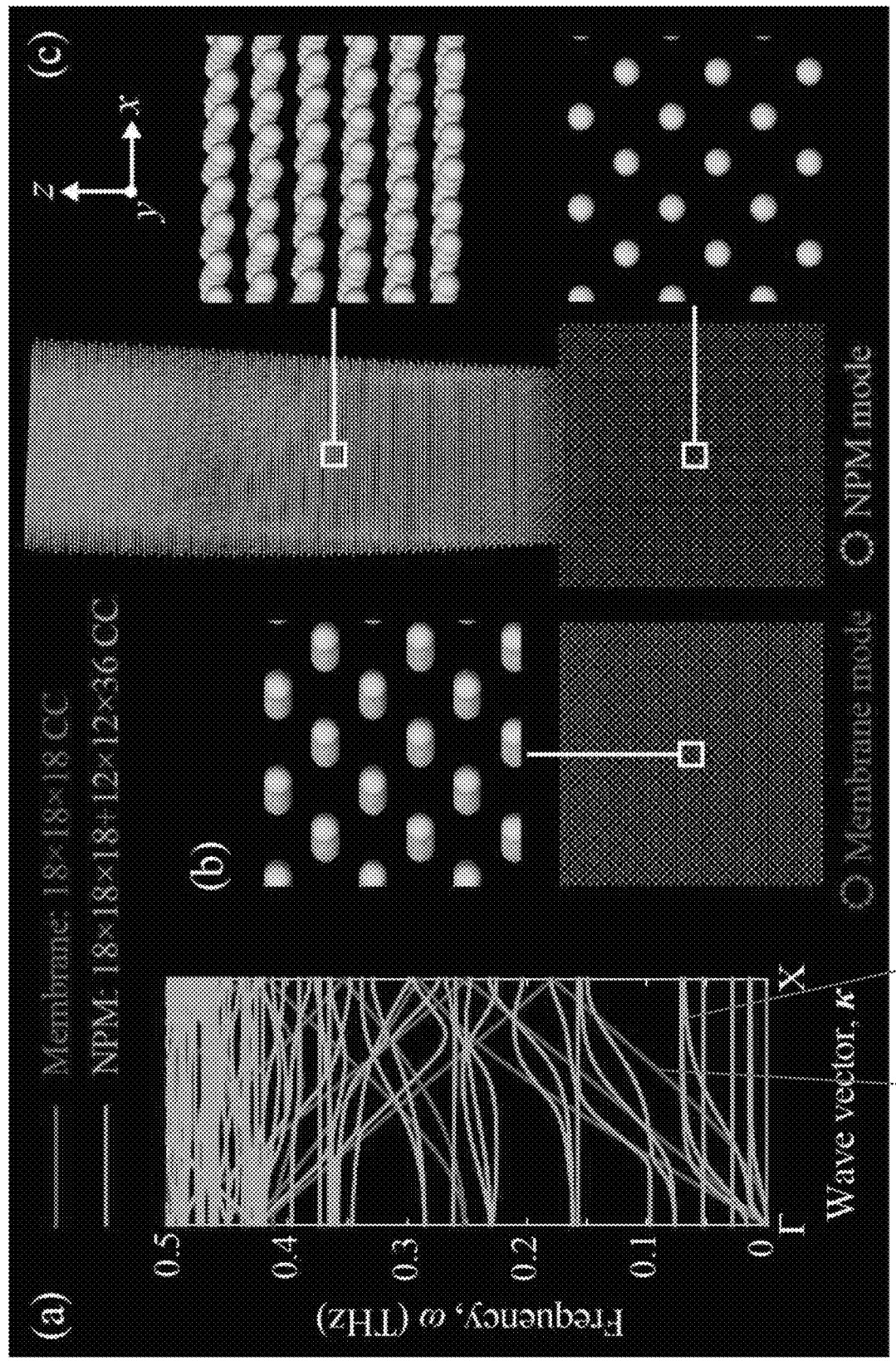
FIG. 3A through 3C illustrate the resonance hybridizations phenomenon in a material comprising nanopillars from a lattice dynamics perspective.

In most materials, heat is transported primarily by phonons 12, a succession of traveling vibrational waves. In a nanophononic metamaterial, the atoms making up the nanowalls or other resonator structure generate stationary vibrational waves 10. These two types of waves interact and hybridize, and this disrupts the heat-carrying phonons 12 in the membrane by two mechanisms: group velocity reduction (FIG. 3A) and mode localization (FIG. 3A). These two effects cause a reduction in the lattice thermal conductivity along the membrane. This mechanism of resonance hybridizations via nanostructuring is independent of the generation and transport of electrical charge 14 and thus will not significantly affect the electrical properties, importantly the Seebeck coefficient and the electrical conductivity.

FIGS. 3A through 3C show illustration of resonance hybridizations phenomenon from a lattice dynamics perspective. In FIG. 3A, phonon band structure of a silicon membrane with silicon nanopillars standing on one surface 20 (green) is shown versus that of a uniform silicon membrane with the same thickness 22 (red). FIG. 3B shows atomic displacements for a standard heat-carrying phonon indicating activity within the silicon membrane portion. In FIG. 3C, atomic displacements of a hybridized mode revealing localized nanopillar motion and almost "thermal silence" in the silicon membrane portion. A small model (88128 atoms in the unit cell) is displayed for clarity.

Example implementations of nanophononic metamaterial-based thermoelectric devices described herein are based upon these theoretical advances in nanophononic metamaterial design. In contrast, conventional advanced thermoelectric devices have n- and p-type semiconductor legs comprised of $Bi_2Te_3$, half-Heusler, or skutterudite materials. These have reproducibly been shown to achieve up to ~9% efficiency for a hot-side T of 500° C. with a ZT of below 1. Key limitations are the intrinsic material ZT, the expense of using bulk ceramic processing to make electronic devices, and the thermomechanical challenges that monolithic ceramics present. While the reliability of thermoelectric devices is often touted due to the success of thermoelectrics in NASA space missions, the reality is that terrestrial applications experience significant thermal cycling and thermal shock issues that too often lead to catastrophic failure. In contrast to conventional thermoelectric devices such as these, NPM-based thermoelectric devices may employ a similar macrostructure of alternating n- and p-type legs, but the active thermoelectric material(s) can be fabricated from a low-cost and less brittle crystal, such as silicon, shaped using nanoscale extensions of techniques that are already scaled industrially in MEMS devices such as those found in automobile airbag systems, cell phones, and many other applications.

Figure 11:
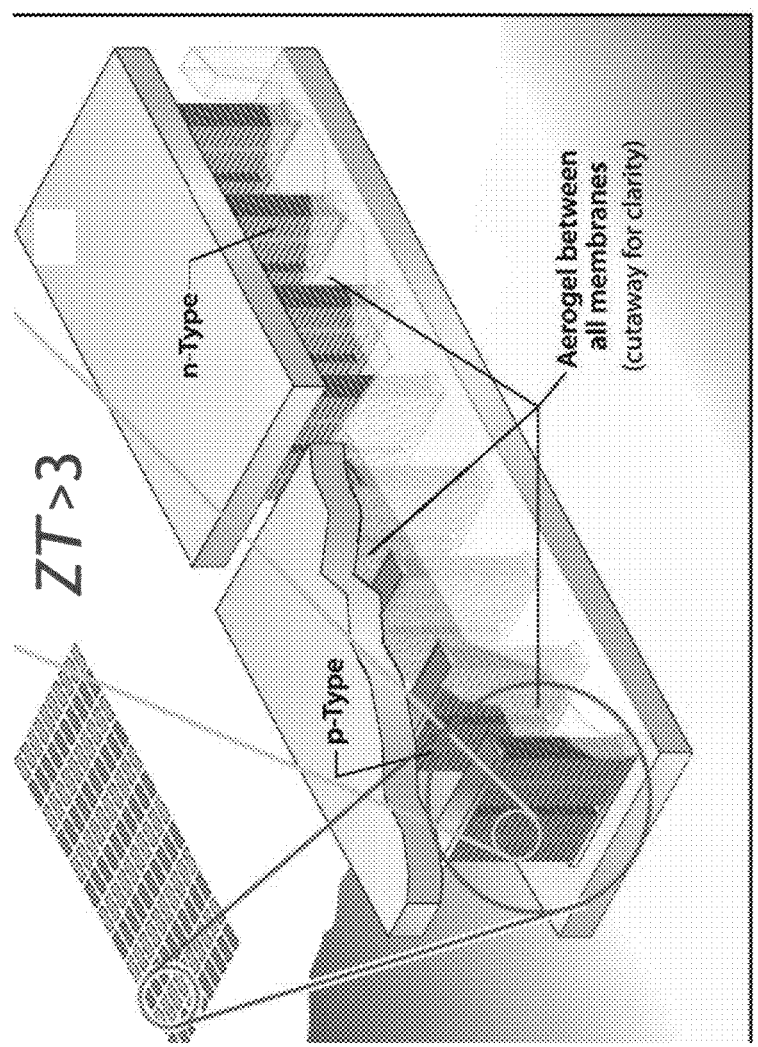
FIG. 11 show another example configuration of n-type and p-type legs of a thermoelectric energy conversion device shown in an inset from an array of a larger thermoelectric energy conversion device.

In one implementation, for example, a thermoelectric device may comprise a hot-side silicon nanophononic thermoelectric device with an approximately 18% heat-to-electricity efficiency, operating between a hot-side temperature of 325° C. and room temperature. Thermal transport in each thermoelectric device leg may be mainly by electrical carriers traveling through many ~300 nm thin membranes that are connected in parallel thermally, providing a desired thermoelectric voltage and current. The phonon thermal conductivity in each membrane may be suppressed by nanowalls connected to the membrane, such as shown in FIG. 2, to a few percent of the thermal conductivity of bare silicon membranes. Theoretical calculations indicate that these nanophonic metamaterial membranes may have bulk silicon Seebeck coefficients and electrical conductivity, for a ZT of approximately 3, about 480 times the ZT of bulk Si. Between layers of parallel silicon membranes, thermally-insulating material, such as aerogel, support/insulating layers can be disposed (e.g., dried in-place) on stacks of silicon nanostructures after the assembly of the full device is complete; these layers can fill the spaces between the alternating n-type and p-type doped NPM structures, such as shown in FIG. 11. In this example implementation, the entire thermoelectric device may be assembled in liquid before contacts are applied to leg ends, interconnections are made, and the devices are packaged for use. Many promising waste-heat harvesting applications are anticipated for thin (~1 mm) high-efficiency thermoelectric device sheets (see, e.g., FIG. 11).

Figure 4:
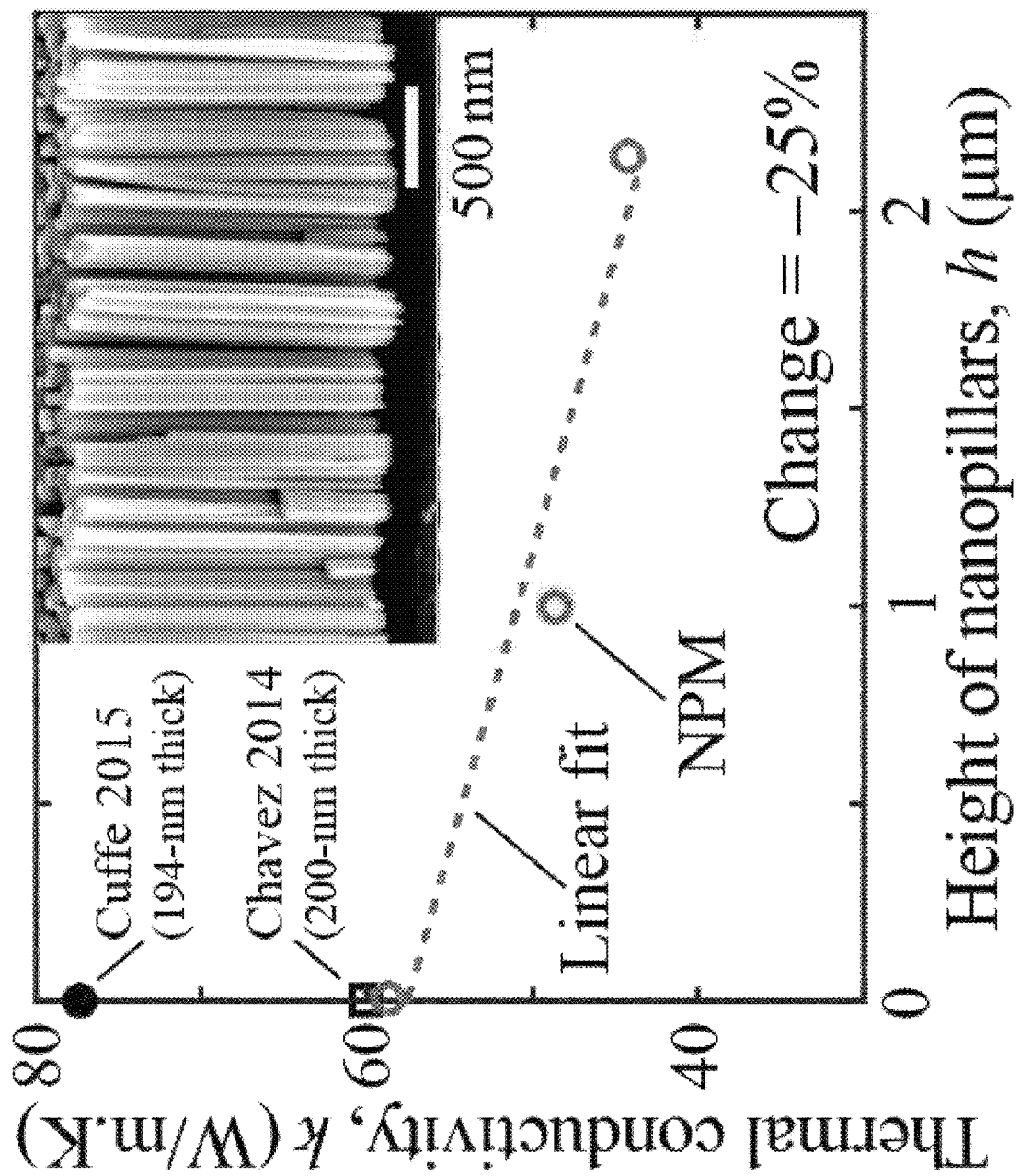
FIG. 4 shows preliminary experimental results for a membrane comprising nanopillars.

FIG. 4 shows preliminary experimental results: up to 25% decrease in membrane κ as nanopillar height increases. Taller nano-pillars exhibit more resonances, and therefore a greater reduction in κ. The inset displays GaN nanopillars grown on a 200-nm Si membrane at NIST.

Figure 5:
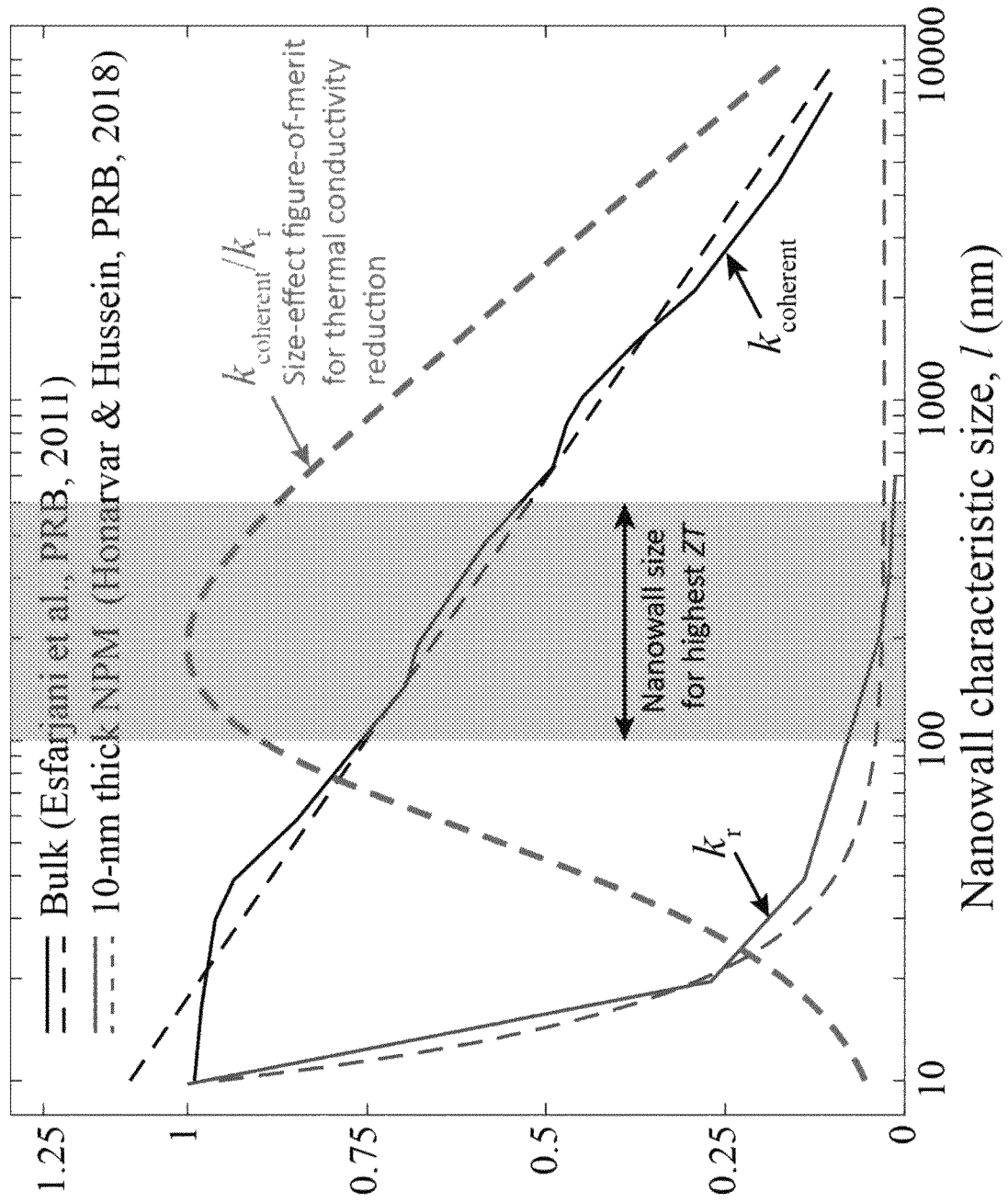
FIG. 5 shows a size-effect figure-of-merit for thermal conductivity reduction in a nanophononic metamaterial.

Because the underlying phenomenon of resonance hybridization is fundamentally a highly size-dependent nanoscale phenomenon, the sizes and relative sizes of the silicon membranes and nanowalls are elements to the success of nanophononic metamaterials and by extension thermoelectric devices based on nanophononic metamaterials. Increasing nanowall width increases the number of nanowall modes available to disrupt κ in the membrane, but phonon-phonon scattering within overly wide nanowalls suppress this effect. Based upon this, a figure of merit that predicts the optimum size scale for important nanoscale features has been developed. FIG. 5 shows size-effect figure-of-merit for thermal conductivity reduction in a proposed concept. The quantity $k_r$ denotes NPM κ divided by κ for a uniform membrane, and $k_{coherent}$ represents the wave-based mechanisms contribution to κ of bulk silicon. FIG. 5 provides a heuristic analysis of this figure of merit that shows that, for this particular example, an optimal characteristic width of the nanowalls ranges from 100 nm to 500 nm. As for the membranes, the smaller the thickness the more κ reduction, because thin membranes mean fewer heat-carrying phonon modes and a strong reduction by hybridization to the many nanowall modes. In one implementation, 300-nm thick membranes and nanowalls that are 400-nm wide and 2-µm tall may be provided.

Implementations provided may also be constructed via a manufacturable nanoimprint-based manufacturing and 2) relatively inexpensive self-assembly methods for these NPM thermoelectric devices. In one implementation, for example, a process such as one of the relatively low-cost self-assembly technologies developed for Micro-LED displays may be used.

In one implementation, cost-effective conversion of waste heat to electricity may be based on the ability to reduce the thermal conductivity of silicon layers using nanophononic metamaterial designs used in a nanophononic metamaterial-based thermoelectric energy conversion device. Silicon has a high Seebeck coefficient and high mobility, so implementations may include degenerately doped starting materials for high conductivity. These material properties, combined with nanophononic metamaterial reduction in thermal conductivity, may provide relatively high thermoelectric figure of merit ZT values for the nanophononic metamaterials used in a nanophononic metamaterial-based thermoelectric energy conversion device. Implementations of a nanophononic metamaterial-based thermoelectric energy conversion device and fabrication processes for forming such devices, by utilizing silicon-based nanophononic metamaterials may also take advantage of the well-established manufacturing base for silicon processing, including low-cost thin substrates, nanoimprint lithography and high-aspect-ratio etching technologies developed for microelectromechanical systems (MEMS) and nanowire applications. Other materials are available with better intrinsic thermoelectric properties, such as BiSbTe alloys, PbTe, half-Heusler alloys, and SiGe alloys, and their use in a nanophononic metamaterial could improve upon the ZT of a comparable Si NPM and, thus, improve the efficiency of a nanophononic metamaterial-based thermoelectric energy conversion device utilizing those nanophononic metamaterial components. Of these, SiGe may be an alternative candidate to silicon given the nanofabrication required to achieve relatively high ZT values that would lead to improved efficiency in a nanophononic metamaterial-based thermoelectric energy conversion device.

Figure 6B:
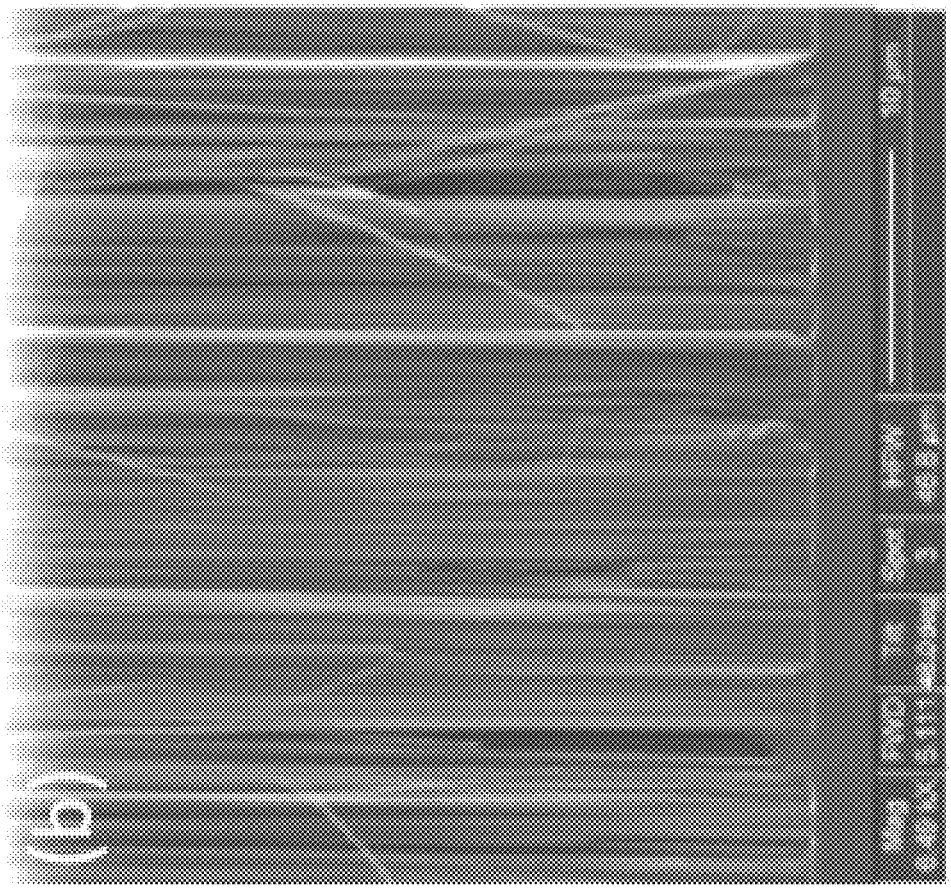
FIGS. 6A and 6B show examples of high-aspect ratio etching of silicon.
Figure 6A:
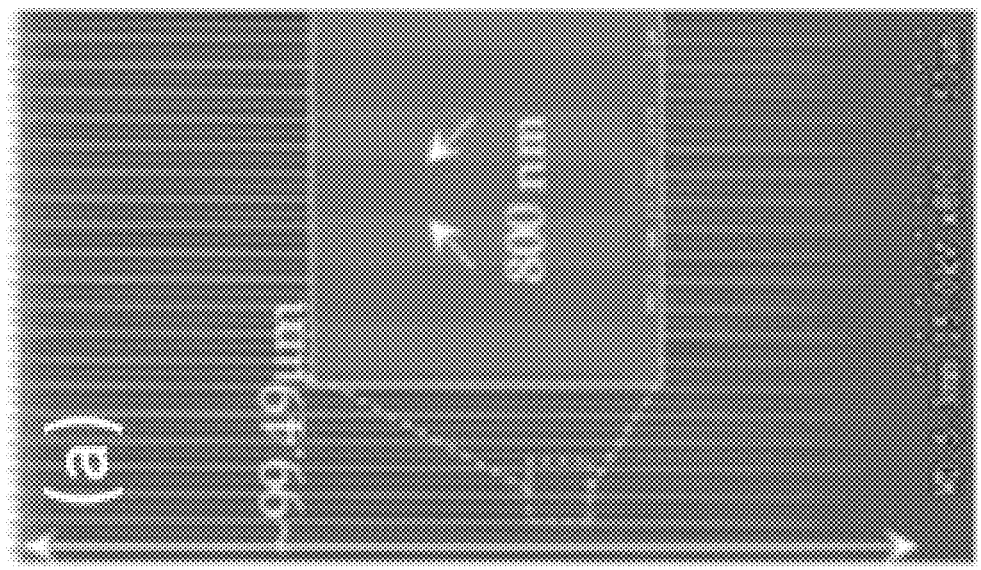

In one implementation, for example, a nanophononic metamaterial design may be guided by theoretical work defining the best length scale (~300±100 nm) for obtaining high ZT (see FIG. 5) in a membrane with nanofeatures on both sides so as to improve efficiency of a nanophononic metamaterial-based thermoelectric energy conversion device. Nanowalls ~400 nm wide, separated by high aspect ratio trenches, can be fabricated on thin membranes using deep reactive ion etching (DRIE), as shown in FIG. 6A. Metal-assisted chemical etching [MACE, shown in FIG. 6B] is another alternative for fabrication. A fast phonon band-structure calculation scheme that covers the entire frequency spectrum of Si phonons may also be used. A thermoelectric device design may also be optimized for high efficiency, high real power density and ease of manufacturing.

Figures 7A, 7B, 7C, 7D:
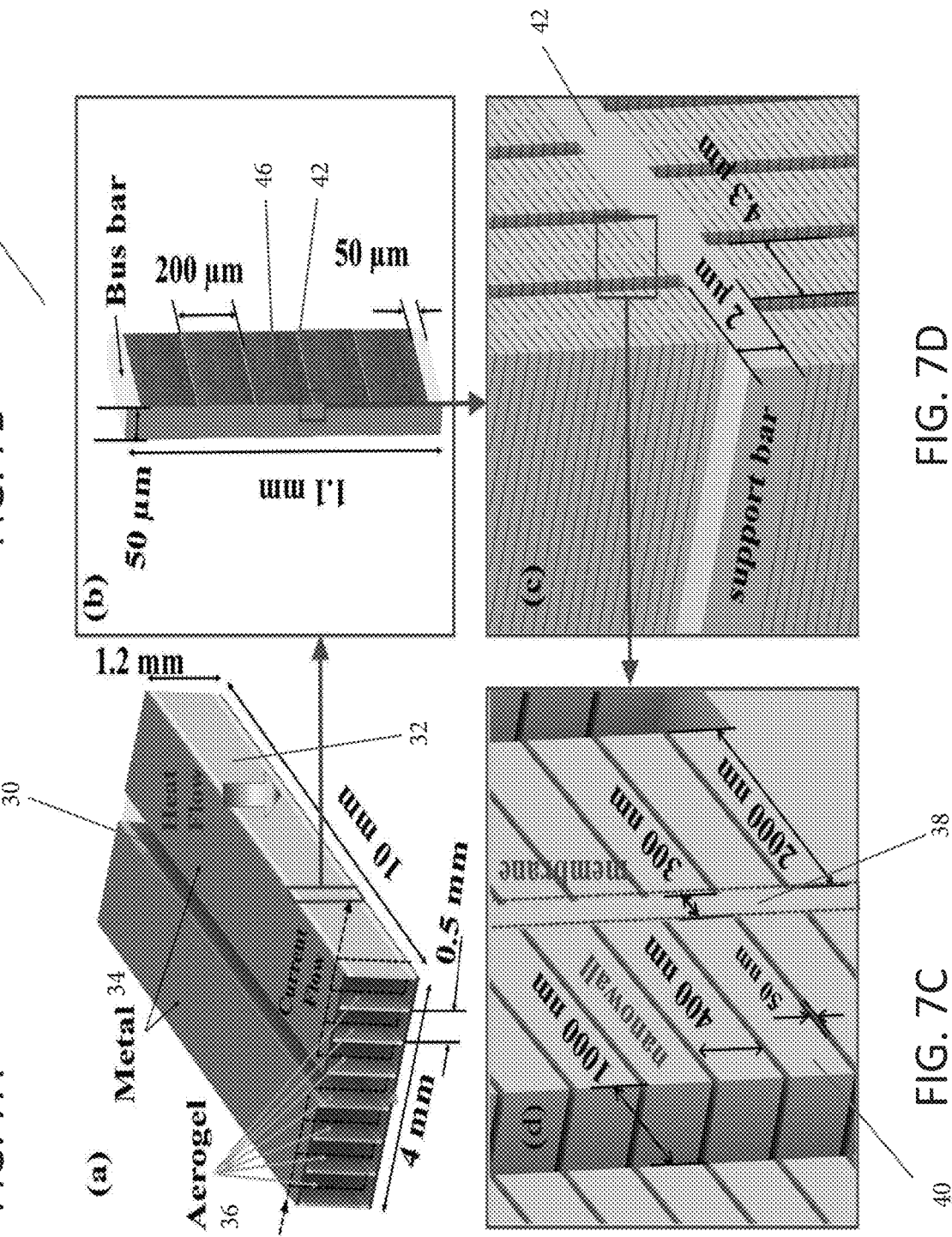
FIGS. 7A through 7D depict progressive inset views of an example implementation of a nanophononic metamaterial (NPM) based thermoelectric conversion device.

FIGS. 7A-7D depict progressive inset views of an example implementation of an NPM-based thermoelectric energy conversion device. Thermoelectric energy conversion device architecture, zoomed to increasing magnification from upper left, clockwise (arrows). FIG. 7A show a complete example implementation of a thermoelectric device with n-type 32 and p-type 30 nanostructured silicon layers separated by aerogel 36 (transparent) with metallization 34 (brown). FIG. 7B shows an individual strip unit of silicon 44, without gel. In the particular implementation shown in FIG. 7B, for example, the strip unit 44 comprises five individual unit cells 46, each separated by a support bar 48 to provide structural support to the strip unit 44 and redundant electrical and thermal transport in the event of a membrane 38 failure. FIG. 7C shows as-etched silicon strip units, with support bars supporting individual unit cells 46 and connecting parallel membranes 38 to provide mechanical support and redundant transport paths in case of single membrane failure. FIG. 7D shows example nanophononic metamaterial dimensions, with a nanomembrane running vertically. Membrane 38 thermal conductivity is dramatically reduced by phonon resonances generated by the dense array of nanowalls 40.

In the particular implementation shown in FIGS. 7A through 7D, for example, the architecture allows massively parallel fabrication of the nanoscale features. In this example, FIG. 7D shows nanoscale features that may be manufactured on wafer scale (e.g., 12-inch) production equipment while simultaneously defining 'strips units' shown in FIG. 7(b), shown without heat insulating material (e.g., gel such as aerogel) attached that will become individual die. The die will be combined to form n-type 32 and p-type 30 thermoelectric device legs stacks that are then metallized as shown in FIG. 7A. In this particular implementation, the patterns may be generated with electron beam lithography to allow rapid fabrication and testing. Patterning can also be generated via nanoimprint lithography in other implementations allowing for mass production. To orient the resulting die for massively parallel heat conduction through the nanophononic membranes, the die can be released from carrier wafers, rotated and stacked in a packaging fixture. Prior to this release, the nano-featured membranes can be stabilized and isolated with layers of silica-based aerogels in which polysiloxane chains are incorporated for increased mechanical strength. Aerogels are less thermally conducting than air; their use prevents the support layers from being a thermal short across the thermoelectric device. Although some devices may be assembled manually, a simple self-assembly scheme for inexpensive device manufacturing at scale can also be used. The device is finished with metal contacts on the top and bottom [see, e.g., FIGS. 7A and 11] to access the generated electrical power and spread heat to the silicon support bars co-etched with the membranes. Devices are then packaged to provide additional mechanical support to the films, and environmental protection.

FIG. 11 shows another example configuration of n-type and p-type legs of a thermoelectric energy conversion device shown in an inset from an array of a larger thermoelectric energy conversion device. As shown in the example of FIG. 11, each leg includes four individual strip units. However, any number of strip units may be assembled to form a leg of a thermoelectric energy conversion device depending on device requirements.

Thermal conductivity, electrical conductivity, Seebeck coefficient, and power conversion efficiency of the nanophononic metamaterial can be tested on 1) single-layer silicon strip units 2) on assemblies of strip units that will form single thermoelectric device legs and 3) on a complete thermoelectric device with both n-type and p-type legs. Custom test fixtures and assembly fixtures can be designed, fabricated and calibrated for different stages of the work. Efficiency measurements can also be carried out in vacuum to avoid errors from convective and conductive thermal paths through air surrounding the device.

In one particular implementation, the final form factor of a manufactured product is that of an ~1-mm thin sheet that behaves like an excellent thermal insulator while producing electricity. The thermal resistance of the membrane layers is unusually high, so relatively large temperature differences can be sustained across them, specifically about 300° C. over 300 μm of active layer material, with a heat flow density of about 5 W/cm².

Figure 8A:
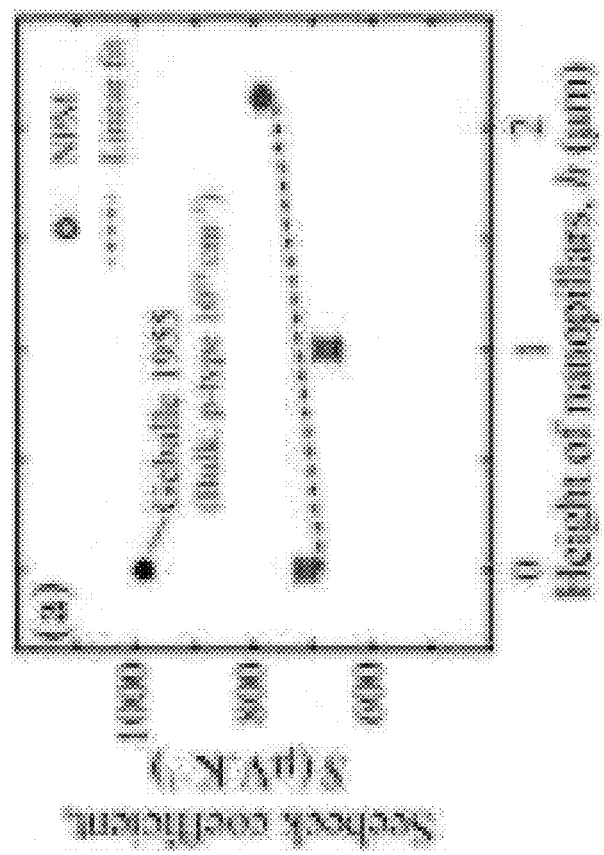
FIGS. 8A and 8B show experimental results for a nanopillared membrane.
Figure 8B:
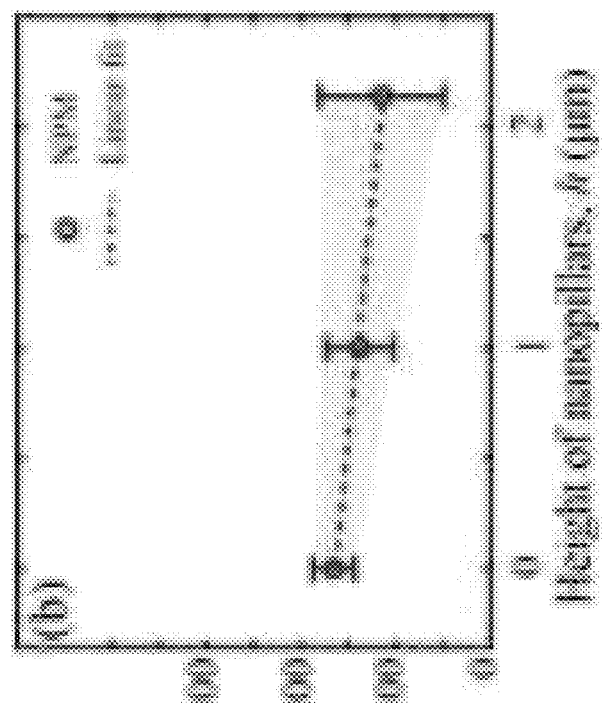

Preliminary experimental results on silicon membranes coated with an 8-nm aluminum nitride (AlN) buffer and GaN nanopillars grown by molecular beam epitaxy were obtained. As shown in FIG. 4, a 25% decrease in thermal conductivity due to resonance hybridizations is observed. The thermal conductivity reduction grows larger as the nanopillar height increases, as predicted by theory. In addition, electrical measurements confirm the electrical integrity of the silicon membrane has not been substantially affected by the addition of nanopillars. FIG. 4 shows the 25% decrease in thermal conductivity in these samples. FIGS. 8A and 8B show preliminary experimental results: Electrical properties of Si membranes coated with randomly nucleated GaN nanopillars demonstrating minimal impact on the electrical conductivity. The electrical conductivity data shown in FIG. 8B is based on measurements of two membranes from each growth run. Although there is a slight downward trend in the electrical conductivity as the nanopillar height increases, the uncertainty in this small data set is quite large and the observed changes are not statistically significant. Seebeck coefficient measurements for these samples [FIG. 8A] were also made. The membrane Seebeck coefficients are approximately constant with a value around 700 μV/K, which is somewhat less than the bulk value for lightly p-type Si of 1100 μV/K. These data show that nanopillar addition reduces the thermal conductivity while having no significant effect on the electrical power factor ($\sigma S^2$), as predicted for nanophononic metamaterials.

Figures 9A, 9B:
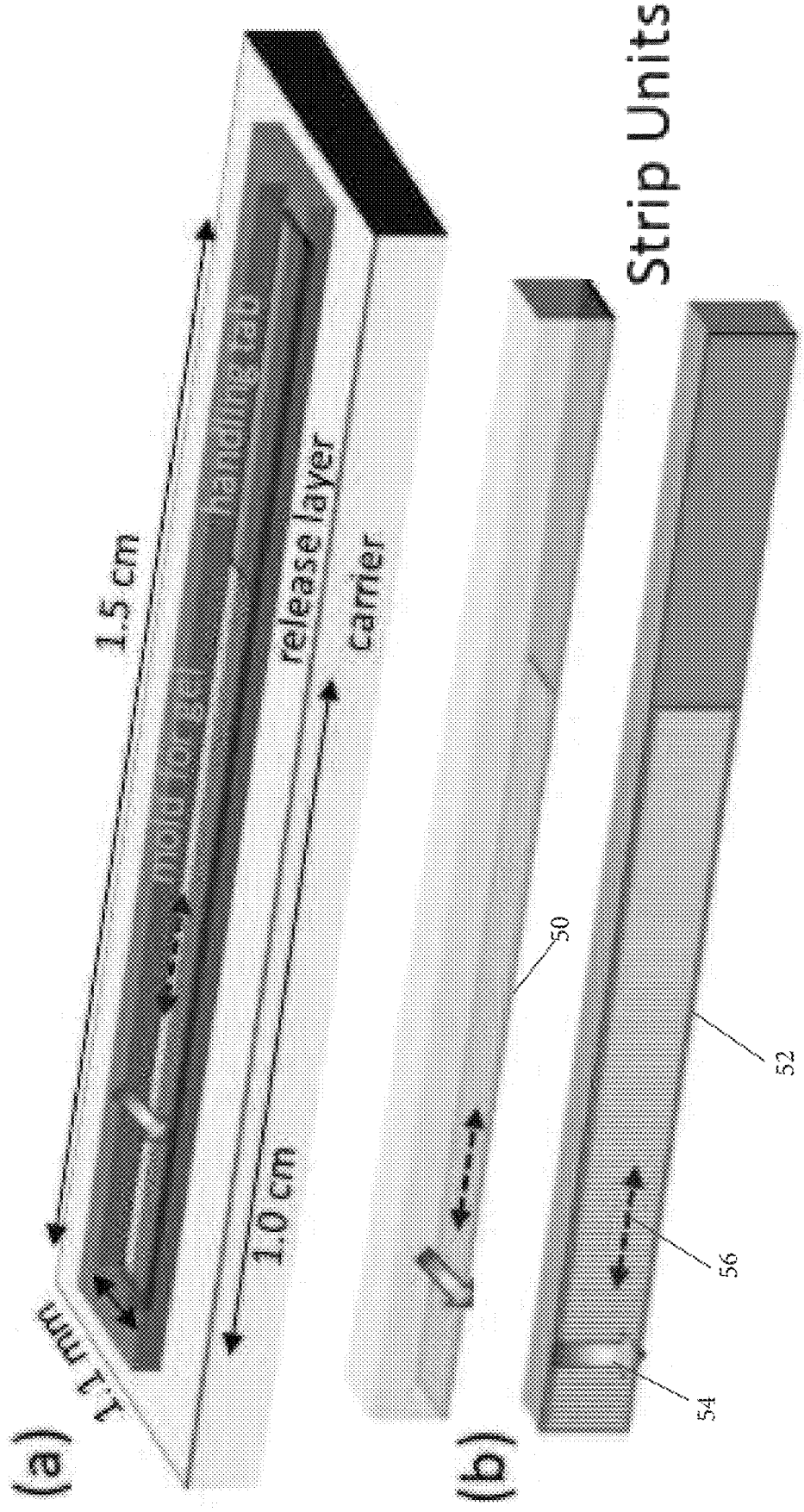
FIGS. 9A and 9B show device components and final assembly of a strip unit of a nanophononic metamaterial (NPM) based thermoelectric conversion device.
Figure 10:
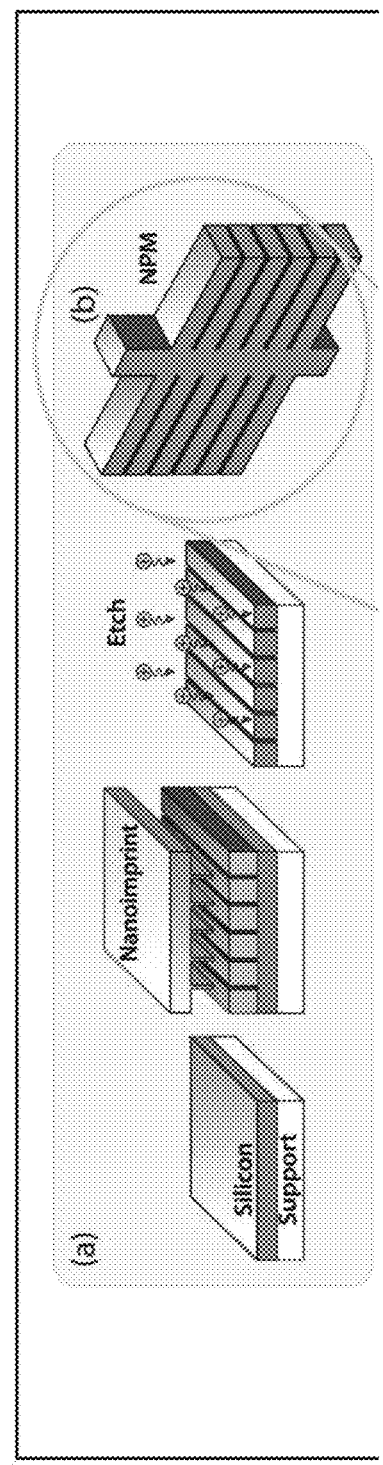
FIG. 10 shows depictions of example fabrication steps for forming a strip unit for a thermoelectric energy conversion device.
Figure 12:
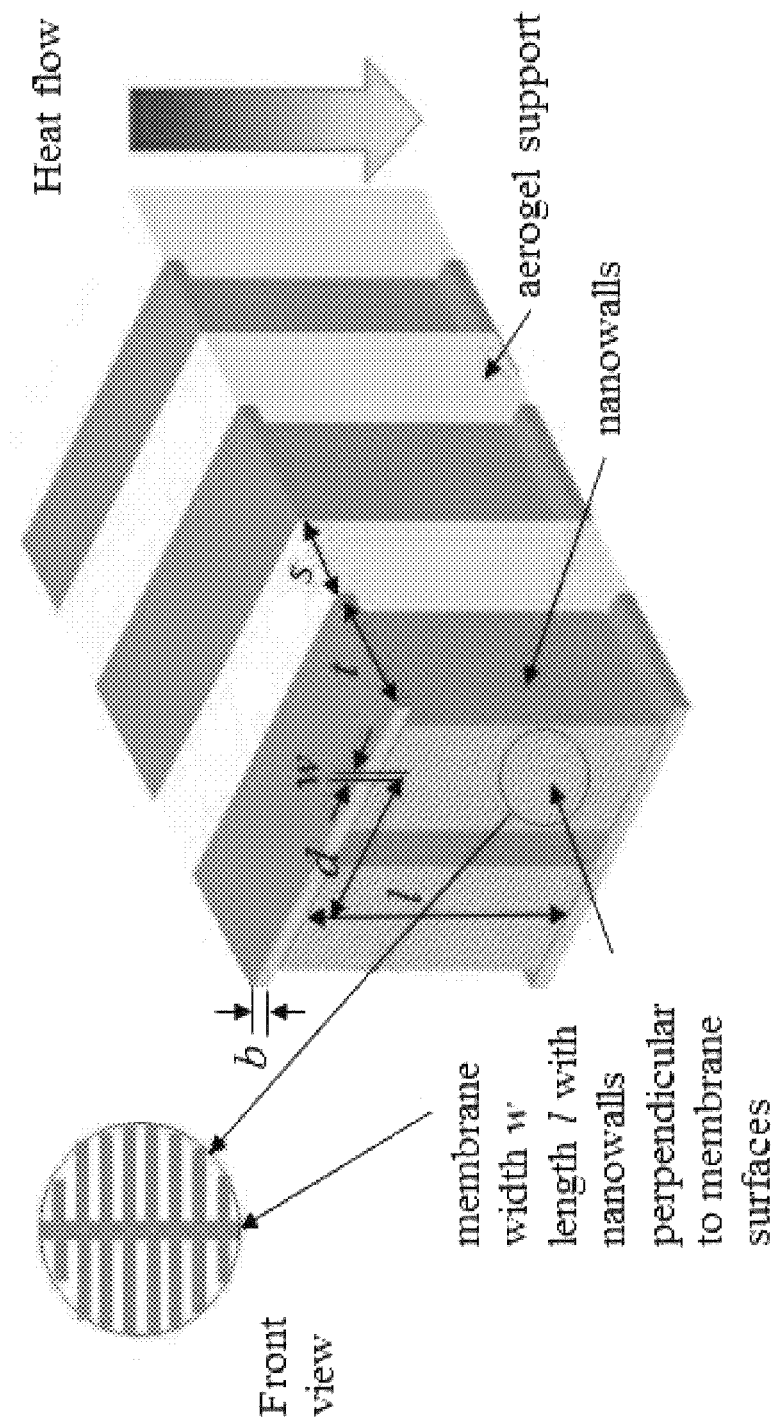
FIG. 12 illustrates an example implementation of a thermoelectric energy conversion device comprising parallel membranes with nanowalls disposed at least generally perpendicular to membrane surfaces of the device.

In some implementations, manufacturing processes may include nanomembrane fabrication with high aspect ratio trenches, and molded aerogel support fabrication compatible with process flow. These tasks are interrelated in these implementations because the lithographic and fabrication chemistry of each process step should be compatible with two disparate materials—silicon and aerogel. Thus, in some implementations, commercially available thin silicon substrates with thicknesses from 25 μm to 100 μm that will be wax-bonded to sapphire carrier wafers during lithography, gel molding, and solvated gel formation steps can be used. Table 1 describes example fabrication steps. FIGS. 9A and 9B show a partially completed device at various stages. FIG. 10 shows corresponding depictions of various example steps of fabricating a strip unit for a thermoelectric energy conversion device. In FIG. 12, the example steps include attaching a thin silicon layer to a support (e.g., carrier wafer), nanoimprinting a resist to form a pattern of a nanomembrane and nanostructure resonators, etching the nanomembrane and nanostructure resonators to obtain a strip unit, and rotating the strip unit for assembly in a thermoelectric energy conversion device.

TABLE 1

| Step Description | Example Materials/Methodology |
|---|---|
| 1. Attach thin silicon to carrier wafer | Wax bonding to sapphire carrier |
| 2. Pattern strip outline with handling tabs | Photolithography. Include electrical leads and heaters |
| 3. Pattern nanomembranes and nanowalls | Deposit hard mask ($SiO_x$) and pattern with llithography, such as e-beam lithography, nanoimprint lithography, helium ion lithography, or photolithography |
| 4. Form mold for aerogel | Photolithography with thick resist (SU-8, ~600 μm) |
| 5. Etch nanostructures through hard mask | DRIE, cryogenic plasma etch, wet etch, atomic layer etch, MACE |
| 6. Fill mold with gel pre-cursors | Crosslink in place. Wet gel to be converted later into an aerogel |

TABLE 1-continued

| Step Description | Example Materials/Methodology |
|---|---|
| 7. Release strip units into solvent | Acetone, then solvent exchange to isopropanol. Strips remain suspended in alcohol and gel is solvated. |
| 8. Assemble strip units in rotated geometry with Si edges up | Assembly in liquid by a manipulator with a selective omniphobic coating for bonding pieces in alcohol; later, develop self-assembly and/or robotic assembly methods as used in micro-LED displays. |
| 9. Critical point drying of partially packaged device | Wet gel is converted into an aerogel while silica nanostructures remain intact |
| 10. Apply metal electrical contacts that also spread the applied heat well | Etch edges if necessary to expose silicon. TiAu for contacts. |
| 11. Final packaging for test | Fixture designed for excellent thermal and electrical contact |

Table 1 shows example fabrication steps for an example process of manufacturing an NPM-based thermoelectric energy conversion device. FIG. 9 shows device components and final assembly corresponding to completion of (a) Step 4 and (b) Step 7 in Table 1. The direction of heat flow 54 (always in the plane of the membranes) and direction of the nanomembrane walls 56 (dashed blue line) are provided for visual orientation. Membrane color indicates doping type with n-type 50 (blue) and p-type 52 (green).

Nanomembrane Fabrication with High Aspect Ratio Trenches. As indicated in Table 1, prior to etching, the silicon, in this example, will be mounted on a carrier wafer and coated with a SiOx hard mask, and the larger features such as the strip outline will be defined with photolithography. The design includes wide bus bars at the top and bottom of the membrane assemblies which serve primarily as funnels for heat and electronic carrier flow in and out of the membranes. Excess material may be included to allow for handling the strip units for assembly; these handling tabs can be removed in a later step.

As described in more detail below, a self-assembly process to join the strip units prior to critical point drying may also be used. In this example, the membranes themselves are formed by etching trenches into the plane of the silicon wafer from both sides, with its cross-sectional area being defined by the wafer thickness [50 μm in FIG. 7B] and the spacing between the termination of the gaps—the membrane width of 300 nm in FIG. 7D. The membrane/nanowall pattern is defined initially using electron beam lithography, and in some implementations the process may be changed to nanoimprint lithography. Prior work has shown that dimensions on the order of 50 nm over large areas are attainable with this method.

Molded Aerogel Support Fabrication Compatible with Process Flow. In various example implementations, aerogels provide a mechanical support/integration of nanofabricated components along with thermal insulation.

Thermoelectric Device Integration, Assembly and Test Fixture. For the assembly and testing, the process may include the following: 1) assemble and fix strip units on a packaging substrate in alcohol before release and metallization processes; 2) use an automated process for mass production to assure excellent manufacturability; and 3) use a test structure for accurate heat flux through a device with an area of ~1 cm$^2$ and 300° C. across its ~1.2 mm thickness.

A test fixture to measure the efficiency of a completed thermoelectric device, such as for a heat transfer experiment with a high heat flux device may be provided. The fixture may further include features such as: a) vacuum chamber to reduce conduction through air; b) radiation shield; c) electrical output with negligible thermal leakage to measure the electricity generated; and d) a second heat flux sensor to measure the temperature difference and heat flow through the device more accurately.

Achieving high thermoelectric efficiency can be achieved by fabricating a narrow central membrane and tightly spaced nanowalls while avoiding significant contact between adjacent nanowalls.

In another implementation, a thin suspended silicon membrane, such as but not limited to approximately 50 nm to 500 nm thick, may be formed with a high density of nanopillars or nanowalls extending (e.g., extending perpendicularly) from the membrane. Although particular implementations may be provided in various designs, other implementations are also contemplated. For example, manufacturing techniques that can exploit the nanophononic metamaterial effect can be used. Multiple device designs can offer compromises between performance and manufacturability. While some implementations may be carried out using electron beam lithography, for example, other implementations may use other techniques, such as but not limited to more cost-effective methods such as nanoimprint lithography. Manufacturing methods may be related to those used in MEMS device technology, for example. In some implementations, for example, devices may include GaN nanopillars grown with molecular beam epitaxy or solution-grown ZnO nanopillars. Other implementations are also possible.

FIG. 12 shows a schematic view of an example implementation of an NPM-based thermoelectric energy conversion device along with example details of structure and estimated dimensions for this particular implementation. In this particular example, only a subcell for one doping type is shown. Structures of both n-type and p-type silicon can be fabricated and joined together in series as separate "legs" of a conventional thermoelectric device. As with other thermoelectric energy conversion devices, they can be used either to generate electricity from the heat flowing through them or have current passed through them to heat or cool other devices.

Figure 13:
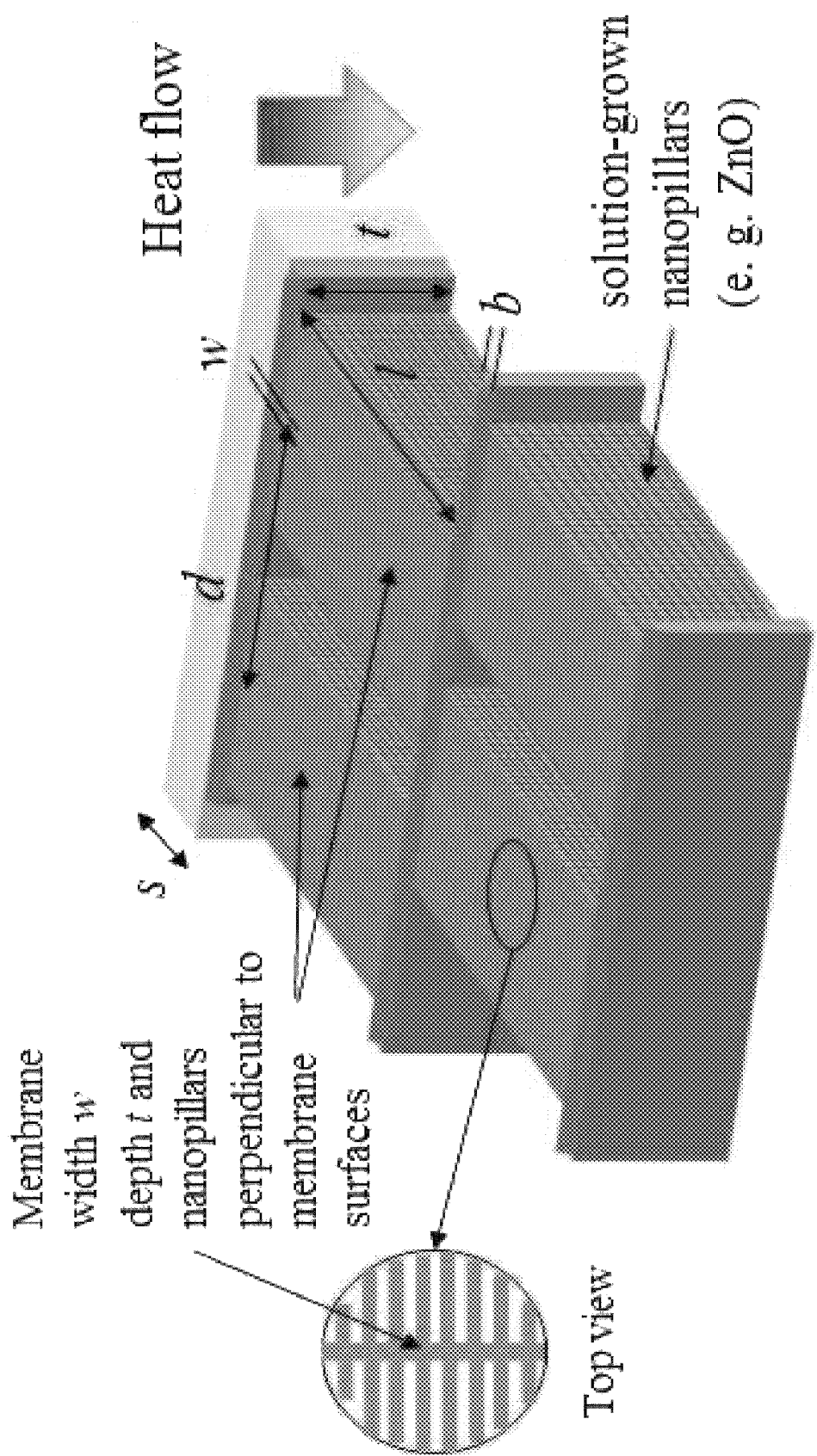
FIG. 13 illustrates a top view of an example implementation of a thermoelectric energy conversion device comprising nanopillars disposed at least generally perpendicular to the membrane surfaces of the device.

FIG. 13 illustrates an example implementation of an NPM-based thermoelectric energy conversion device comprising silicon membranes which are fashioned at regular spacings within a support structure of thicker bars. Nanopillars are grown on sides of membranes in this example, e.g. by solution growth of ZnO nanopillars. Heat can be directed/extracted from top and bottom edges of membrane and support structures without contacting nanopillar forest. In one particular non-limiting implementation, for example, typical dimensions could be approximately w=400 nm, 1=50 μm, and t=20 μm, d=5 μm, and b=5 μm. Support bars can be made of low thermal conductivity material such as silicon oxide or ion-implanted to reduce thermal conductivity. Although many example implementations described herein refer to subtractive nanostructure fabrication (e.g., etching, etc.), this is merely showing non-limiting examples. Additive (e.g., growth such as growth of nanostructures through solution, deposition such as atomic layer deposition, chemical vapor deposition, and molecular beam epitaxy, etc.) and/or subtractive nanostructure fabrication methods may also be used in any of these implementations such that the individual nanostructure features may be constructed by means of additive and/or subtractive fabrication methods.

Figure 14:
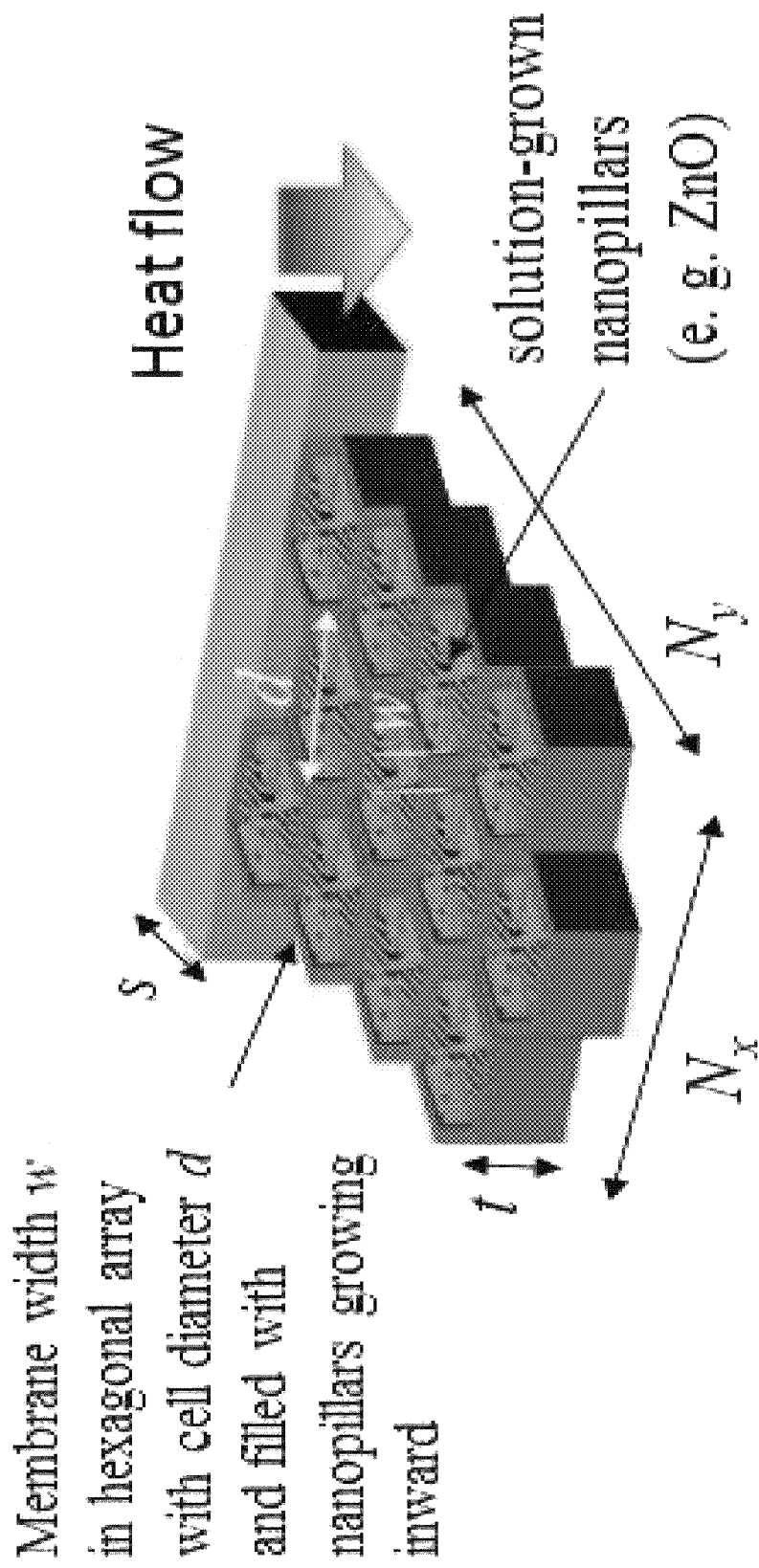
FIG. 14 illustrates a top view of an example implementation of a thermoelectric energy conversion device comprising a membrane width disposed in a hexagonal array of the device, with nanopillars disposed at least general perpendicular to the membrane surfaces of the device.

FIG. 14 illustrates another example implementation of an NPM-based thermoelectric energy conversion device comprising nanostructured silicon membranes of an NPM-based thermoelectric energy conversion device element fashioned generally in a honeycomb pattern within a support structure of thicker bars. Nanopillars can be grown on sides of membranes, e. g. by solution growth of ZnO nanopillars. Heat can be directed/extracted from edges of membrane and support structures without contacting nanopillar forest. In one particular non-limiting implementation, for example, typical dimensions could be approximately w=300 nm, l=50 µm, and t=20 µm, and d=10 µm. Support bars can be made of low thermal conductivity material such as silicon oxide or ion-implanted to reduce thermal conductivity.

In some example implementations, for example, it is estimated that efficiencies on the order of 20% or more for temperature differences of 500° C. to 25° C., which exceeds efficiencies of most commercial thermoelectric devices and exceeds any silicon-based device by more than an order of magnitude. These devices may combine low manufacturing cost with high performance and thus open new application spaces for thermoelectrics including waste heat recovery, chip-scale cryogenic cooling, and compact secondary cooling stages for high-temperature-superconductor generators.

Example Variations of Nanophononic Device Features and Attributes

The membrane from which the walls are extending could be alloyed with appropriate choice of alloy material and concentration to reduce the thermal conductivity further without significantly affecting the electrical conductivity and Seebeck coefficient.

The example device layout in FIG. 11 of could be paired with another identical looking component such that one is n-type and the other p-type and that they get connected in series electrically and in parallel thermally.

Figure 15:
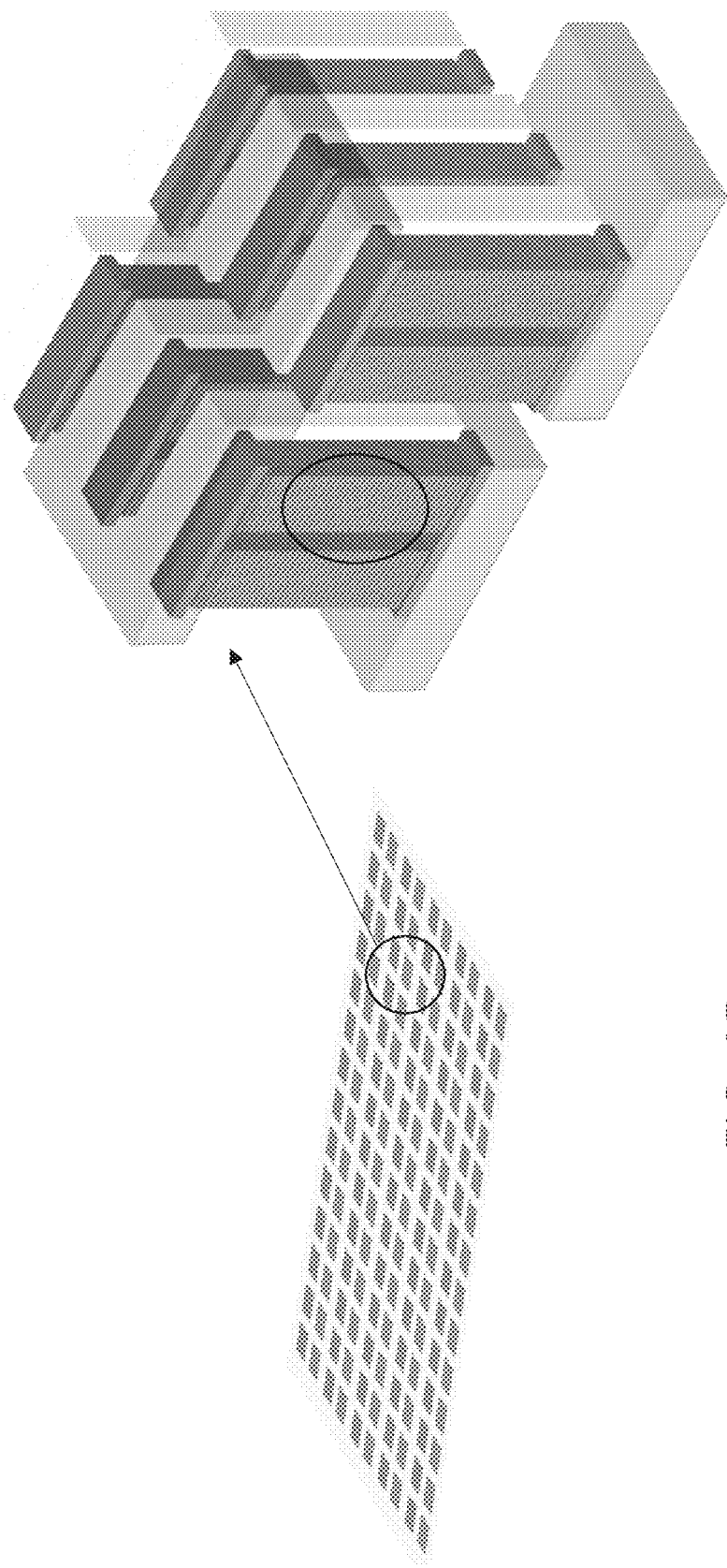
FIG. 15 illustrates an example implementation of a thermoelectric energy conversion device comprising an array forming an integrated unit of the device.

The example device layout in FIG. 12 of could be repeated in an array to form an integrated unit extending to a few millimeters or centimeters in both planar directions, for example, see FIG. 15.

As described above, the internal portion of the device that constitutes a nanophononic metamaterial can be made of other materials and/or geometric configurations, for both the transfer regions and the resonator regions, following the multitude of variations, such as described in the U.S. patent application Ser. No. 15/289,921 entitled "Nanophononic metamaterials" and filed on Oct. 10, 2016, U.S. patent application Ser. No. 15/238,711 entitled "Nanophononic metamaterials" and filed on Aug. 16, 2016, and U.S. patent application Ser. No. 14/247,228 entitled "Nanophononic metamaterials" and filed on Apr. 7, 2014, each of which is incorporated herein by reference in their entirety as if fully set forth herein.

The aerogel support region, such as but not limited to the implementation shown in FIG. 12, could be made of another material with similar properties. The aerogel support region shown in FIG. 14, for example, could be made of a flexible material.

The device shown in FIG. 12 could have any number of repetitions of the membrane/nanowalls and aerogel regions (i.e., not limited to three as shown).

The Device A in FIG. 12 could have lateral variations in doping before the membranes and nanowalls are etched. These would leave the end bars (metallized top and bottom contact bars in FIG. 1) heavily doped either n- or p-type so they make good electrical contact to the metal. These end bars could also be diffusion-doped to ensure the good electrical contact, after the membranes are formed and the sections are diced.

The devices shown in FIGS. 13 and 14 could have nanopillars of materials other than ZnO.

The devices shown in FIGS. 13 and 14 could have the membranes pretreated to control the nucleation of the nanopillars, for example, with atomic layer deposition of seed crystals or metal films that are heated to produce nanodroplets, or etching processes to roughen the surface.

The wafer used for devices in FIGS. 13 and 14 could have lateral variations in doping (from n-type to p-type) to facilitate electrical connections for device operation. These variations could be created with diffusion doping, for example.

The devices in FIGS. 13 and 14 could be manufactured such that the top and bottom are coated with metal before the structure is etched, which facilitates electrical and thermal contact in packaging the device.

Multiple arrays of several millimeters or centimeters in dimension could be combined to create a large network of devices integrated onto a rigid or flexible platform.

The device could be manufactured with a hermetic encapsulation depending on the environmental application.

The above specification, examples and data provide a complete description of the structure and use of exemplary implementations of the invention. Since many implementations of the invention can be made without departing from the spirit and scope of the invention, the invention resides in the claims hereinafter appended. Furthermore, structural features of the different implementations may be combined in yet another implementation without departing from the recited claims.

It is important to recognize, that while certain implementations described herein refer to optimization of one or more feature, system, operation, method, process or the like, actual mathematical or other optimization is not required in other implementations. While it may be possible to "optimize" a particular campaign, one of ordinary skill in the art would recognize from the teachings of the present disclosure, the similar techniques, systems and processes could also be used to improve campaigns, ad delivery or the like without achieving absolute optimization. Rather, different implementations provide for optimization or improved operation, planning, achievement, delivery, etc. of advertising campaigns.

Also, while example time periods and other variables may be used to describe various implementations, other time periods and variables may be used instead.

Although implementations have been described above with a certain degree of particularity, those skilled in the art could make numerous alterations to the disclosed embodiments without departing from the spirit or scope of this invention. For example, while some implementations provide optimal or near-optimal results, others can be constructed to provide improved results without necessarily achieving optimal or even near-optimal results. Further, while examples use various time periods, media choices and the like, these are merely exemplary and not limiting unless expressly recited in the claims. All directional references (e.g., upper, lower, upward, downward, left, right, leftward, rightward, top, bottom, above, below, vertical, horizontal, clockwise, and counterclockwise) are only used for identification purposes to aid the reader's understanding of the present invention, and do not create limitations, particularly as to the position, orientation, or use of the invention. Joinder references (e.g., attached, coupled, connected, and the like) are to be construed broadly and may include intermediate members between a connection of elements and relative movement between elements. As such, joinder references do not necessarily infer that two elements are directly connected and in fixed relation to each other. It is intended that all matter contained in the above description or shown in the accompanying drawings shall be interpreted as illustrative only and not limiting. Changes in detail or structure may be made without departing from the spirit of the invention as defined in the appended claims.

What is claimed:

1. A thermoelectric energy conversion device, comprising:
a first pad that is electrically and thermally conductive, the first pad having a first pad surface;
a second pad that is electrically and thermally conductive, the second pad having a second pad surface that faces the first pad surface; and
a nanophononic metamaterial that creates a heat transfer pathway between the first and second pads, the nanophononic metamaterial comprising one or more strip units located between the first and second pads, each of the one or more strip units comprising:
a membrane having a first edge, a second edge opposite to the first edge, and two opposing membrane surfaces; and
a plurality of nanostructure resonators extending away from the membrane, each of the plurality of nanostructure resonators having a base that directly connects to one of the two opposing membrane surfaces;
wherein:
the first edge of at least one of the one or more strip units is directly connected to the first pad surface; and
the second edge of at least one of the one or more strip units is directly connected to the second pad surface.

2. The thermoelectric energy conversion device of claim 1, each of the plurality of nanostructure resonators comprising a nanopillar or a nanowall.

3. The thermoelectric energy conversion device of claim 2, wherein the plurality of nanostructure resonators reduce a thermal conductivity of the membrane via one or more of resonance hybridization, mode localization, and phonon lifetime reduction.

4. The thermoelectric energy conversion device of claim 1, wherein each of the one or more strip units is an n-type or p-type doped semiconductor.

5. The thermoelectric energy conversion device of claim 1, wherein the one or more strip units are attached to an aerogel layer.

6. The thermoelectric energy conversion device of claim 1, wherein the membrane has a thickness between 20 nm and 500 nm.

7. The thermoelectric energy conversion device of claim 1, wherein:
the membrane is perpendicular to a height dimension of each of the plurality of nanostructure resonators; and
neighboring ones of the plurality of nanostructure resonators are separated by a gap between 10 nm and 200 nm.

8. The thermoelectric energy conversion device of claim 1, wherein the first pad is parallel to the second pad.

9. The thermoelectric energy conversion device of claim 1, the one or more strip units comprising a plurality of strip units whose first and second edges are connected to each other to form an array.

10. The thermoelectric energy conversion device of claim 9, the array being a hexagonal array.

11. The thermoelectric energy conversion device of claim 10, the array being a rectangular array.

12. The thermoelectric energy conversion device of claim 1, wherein:
the one or more strip units comprises a first strip unit and a second strip unit; and
the second edge of the first strip unit is directly connected to the first edge of the second strip unit such that the membranes of the first and second strip units form an oblique angle therebetween.

13. The thermoelectric energy conversion device of claim 1, the one or more strip units comprising a plurality of strip units connected in series between the first and second pads.

14. The thermoelectric energy conversion device of claim 1, the one or more strip units comprising a plurality of strip units connected in parallel between the first and second pads.

15. The thermoelectric energy conversion device of claim 1, wherein:
the first edge of a first strip unit, of the one or more strip units, is directly connected to the first pad surface such that the two opposing membrane surfaces of the first strip unit are perpendicular to the first pad surface; and
the second edge of a second strip unit, of the one or more strip units, is directly connected to the second pad surface such that the two opposing membrane surfaces of the second strip unit are perpendicular to the second pad surface.

16. The thermoelectric energy conversion device of claim 1, wherein the one or more strip units are fabricated from silicon, zinc oxide, gallium nitride, silicon germanium, lead telluride, or a combination thereof.

17. The thermoelectric energy conversion device of claim 1, the membrane comprising an electrically conductive material.

18. The thermoelectric energy conversion device of claim 1, wherein for each of the one or more strip units, the membrane and the plurality of nanophononic resonators are fabricated from the same material.

19. The thermoelectric energy conversion device of claim 1, further comprising one or both of:
metallization on a third pad surface of the first pad, the third pad surface being opposite to the first pad surface; and
metallization on a fourth pad surface of the second pad, the fourth pad surface being opposite to the second pad surface.

20. The thermoelectric energy conversion device of claim 1, further comprising one or more support bars located between the first and second pads, the one or more support bars being positioned and shaped to mechanically support the membrane of at least one of the one or more strip units.

* * * * *

UNITED STATES PATENT AND TRADEMARK OFFICE
CERTIFICATE OF CORRECTION

PATENT NO. : 11,588,091 B2
APPLICATION NO. : 16/271823
DATED : February 21, 2023
INVENTOR(S) : Mahmoud Hussein et al.

It is certified that error appears in the above-identified patent and that said Letters Patent is hereby corrected as shown below:

In the Claims

In Claim 18, at Column 14, Line 42:
"nanophononic"
Should read:
-- nanostructure --

Signed and Sealed this
Fourteenth Day of May, 2024

Katherine Kelly Vidal
*Director of the United States Patent and Trademark Office*